(12) United States Patent
Chen

(10) Patent No.: US 10,637,455 B2
(45) Date of Patent: Apr. 28, 2020

(54) DEMODULATION CIRCUIT AND WIRELESS CHARGING DEVICE HAVING THE SAME

(71) Applicant: ANPEC ELECTRONICS CORPORATION, Hsinchu (TW)

(72) Inventor: Chih-Ning Chen, Taipei (TW)

(73) Assignee: ANPEC ELECTRONICS CORPORATION, Hsinchu (TW)

(*) Notice: Subject to any disclaimer, the term of this patent is extended or adjusted under 35 U.S.C. 154(b) by 369 days.

(21) Appl. No.: 15/707,085

(22) Filed: Sep. 18, 2017

(65) Prior Publication Data

US 2018/0006637 A1 Jan. 4, 2018

Related U.S. Application Data

(63) Continuation-in-part of application No. 14/694,189, filed on Apr. 23, 2015, now abandoned.

(30) Foreign Application Priority Data

Feb. 4, 2015 (TW) .............................. 104103742 A

(51) Int. Cl.
*H02J 50/10* (2016.01)
*H02J 7/02* (2016.01)
*H03K 9/08* (2006.01)
*H04B 5/00* (2006.01)

(52) U.S. Cl.
CPC ............ *H03K 9/08* (2013.01); *H02J 7/025* (2013.01); *H02J 50/10* (2016.02); *H04B 5/0031* (2013.01); *H04B 5/0037* (2013.01); *H04B 5/0075* (2013.01)

(58) Field of Classification Search
CPC ....................................................... H02J 7/025
USPC ........................................................... 320/108
See application file for complete search history.

(56) References Cited

U.S. PATENT DOCUMENTS

| 5,339,303 A * | 8/1994 | Yoshimaru | ........... | G11B 7/0045 327/307 |
| 9,014,305 B2 * | 4/2015 | Oettinger | ............... | H02J 7/025 375/324 |
| 2009/0232197 A1 * | 9/2009 | Mimura | ............... | H04B 1/7174 375/239 |

* cited by examiner

*Primary Examiner* — Jerry D Robbins
(74) *Attorney, Agent, or Firm* — Li & Cai Intellectual Property (USA) Office

(57) ABSTRACT

The present disclosure illustrates a demodulation circuit disposed in a wireless charging device. The demodulation circuit comprises a detection unit, a delay unit, a demodulation unit, a switch unit, an amplifier, an ADC, a control unit and a digital demodulation unit. The detection unit detects a pulse width modulation signal received by a coil, and outputs a modulation signal. The delay unit delays the modulation signal to generate a delay signal. The demodulation unit compares the modulation signal with the delay signal to generate a first demodulation signal. When the control unit detects the first demodulation signal is lower than a demodulation success rate in a time period, the control unit outputs a first switch signal to the switch unit. When the control unit detects a second demodulation signal is lower than the demodulation success rate in the time period, the control unit outputs a second switch signal to the switch unit.

14 Claims, 6 Drawing Sheets

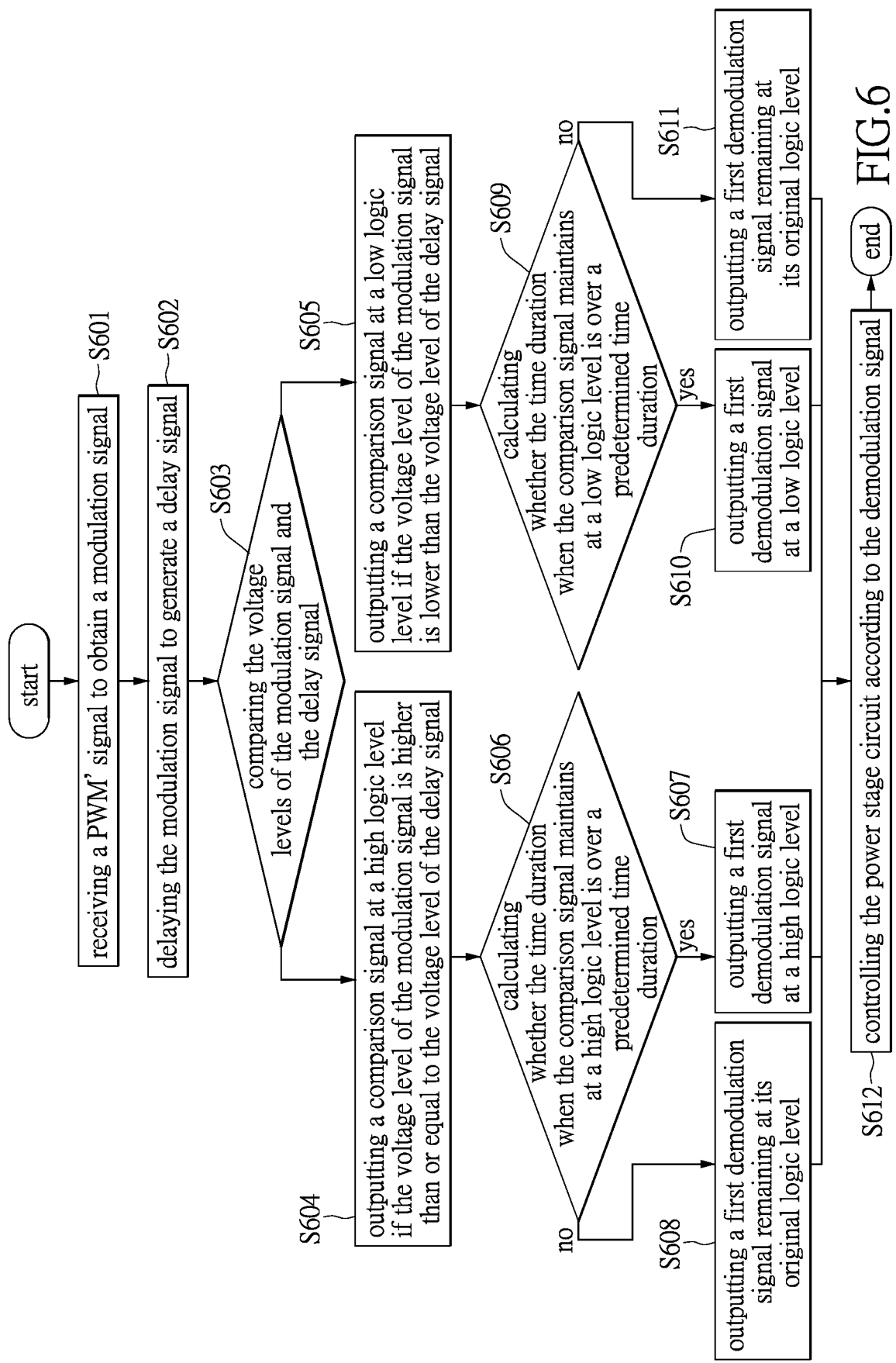

DEMODULATION CIRCUIT AND WIRELESS CHARGING DEVICE HAVING THE SAME

CROSS-REFERENCE TO RELATED APPLICATIONS

This Application is a continuation-in-part of Non-provisional application Ser. No. 14/694,189 filed on Apr. 23, 2015, currently pending.

BACKGROUND OF THE INVENTION

1. Field of the Invention

The instant disclosure relates to a demodulation circuit; in particular, to a demodulation circuit that can demodulate signals fast and a wireless charging device using the same.

2. Description of Related Art

With the development of technology, many kinds of personal mobile devices and wearable devices, which connect with the Internet, provide people a mobile life, and thus increase our daily lives' convenience. However, the requirement of electric power for using these electric products has also gradually increased. For solving this problem, a wireless charging device has been developed currently. The wireless charging devices can be generally categorized as two kinds, wherein one is the wireless charging device using the Electromagnetic Induction Technology and the other is the wireless charging device using the Electromagnetic Resonance Technology. Particularly, the wireless charging device using the Electromagnetic Induction Technology is more common. The advantage of the wireless charging device is that the electric device and the wireless charging device do not need wires to have a connection.

When the wireless charging device (such as a first wireless charging device) receives a signal sent by another wireless charging device (such as a second wireless charging device), the first wireless charging device needs to demodulate the received signal to obtain the signal content. In the prior art, after the demodulation circuit in the wireless charging device receives a signal, the signal would be filtered via a low-pass filter and a high-pass filter and then be processed via an amplifier, so as to distinguish the signal from noise. After that, the demodulation circuit filters out the high-frequency noise of the amplified signal via another filter. The demodulation circuit compares the processed signal and a reference signal via a comparator, and then outputs a signal at a high logic level or a low logic level. Finally, the output signal at a high logic level or a low logic level can be converted to a digital signal via the analog digital converting circuit of the demodulation circuit for a subsequent process via the back end circuit.

From the above, the traditional demodulation circuit has to use a low-pass filter, a high-pass filter, an operational amplifier and a comparator to demodulate a signal, which increases the manufacturing cost and circuit area of the demodulation circuit and also increases the time and power consumption for demodulating signals with an increasing amount of filters and amplifiers.

SUMMARY OF THE INVENTION

The instant disclosure provides a demodulation circuit, used in a wireless charging device and receives a pulse width modulation signal, the demodulation circuit performs near distance wireless charging. The demodulation circuit comprises a detection unit, a switch unit, a delay unit, a demodulation unit, an amplifier, an analog digital convertor, a digital demodulation unit and a control unit. The detection unit is electrically connected to a coil and a power stage circuit for detecting the pulse width modulation signal received by the coil and outputting a modulation signal. The modulation signal is an analog data signal. The switch unit is electrically connected to the detection unit. The delay unit is electrically connected to the switch unit for delaying the modulation signal and generating a delay signal. The demodulation unit is electrically connected to the switch unit and the delay unit for comparing the modulation signal and the delay signal so as to generate a first demodulation signal. The first demodulation signal is a binary data signal. The amplifier is electrically connected to the switch unit for amplifying the modulation signal. The switch unit is used to output the modulation signal to the amplifier, the delay unit or the demodulation unit. The analog digital convertor is electrically connected to the amplifier, the analog digital convertor transforms an analog modulation signal into a digital modulation signal.

When the voltage level of the modulation signal is higher than or equal to a voltage level of the delay signal, the demodulation unit outputs a high logic level first demodulation signal to the control unit. When the voltage level of the modulation signal is lower than the voltage level of the delay signal, the demodulation unit outputs a low logic level first demodulation signal to the control unit. When the control unit detects the first demodulation signal is lower than a demodulation success rate in a time period, the control unit outputs a first switch signal to the switch unit, the first switch signal is used to control the switch unit to output the modulation signal to the amplifier.

The digital demodulation unit is electrically connected to the analog digital convertor for generating a second demodulation signal. When the modulation signal is decoded to the second demodulation signal, the digital demodulation unit outputs the second demodulation signal to the control unit. When the control unit detects the second demodulation signal is lower than the demodulation success rate in the time period, the control unit outputs a second switch signal to the switch unit, the second switch signal is used to control the switch unit to output the modulation signal to the delay unit and the demodulation unit.

The instant disclosure further provides a wireless charging device, used to receive a pulse width modulation signal, the wireless charging device performs near distance wireless charging. The wireless charging device comprises a coil, a power stage circuit and a demodulation circuit. The coil is configured to receive the pulse width modulation signal. The power stage circuit is electrically connected to the coil, and configured to output a voltage or an electromagnetic energy to the coil. The demodulation circuit is electrically connected to the coil, and the power stage circuit, and comprises a detection unit, a delay unit, a demodulation unit, an amplifier, an analog digital convertor, a digital demodulation unit and a control unit. The control unit is electrically connected to the power stage circuit, and configured to control the power stage circuit. The detection unit is electrically connected to the coil and the power stage circuit, and configured to detect the pulse width modulation signal received by the coil and to output a modulation signal, the modulation signal is an analog data signal. The switch unit is electrically connected to the detection unit. The delay unit is electrically connected to the switch unit, and configured to delay the modulation signal and to generate a delay signal.

The demodulation unit is electrically connected to the switch unit and the delay unit, and configured to compare the modulation signal and the delay signal so as to generate a first demodulation signal. The first demodulation signal is a binary data signal. The amplifier is electrically connected to the switch unit for amplifying the modulation signal, the switch unit is used to output the modulation signal to the amplifier, the delay unit or the demodulation unit. The analog digital convertor is electrically connected to the amplifier, the analog digital convertor transforms an analog modulation signal into a digital modulation signal.

When the voltage level of the modulation signal is higher than or equal to a voltage level of the delay signal, the demodulation unit outputs a high logic level first demodulation signal to the control unit. When the voltage level of the modulation signal is lower than the voltage level of the delay signal, the demodulation unit outputs a low logic level first demodulation signal to the control unit. When the control unit detects the first demodulation signal is lower than the demodulation success rate in the time period. The control unit outputs a first switch signal to the switch unit, the first switch signal is used to control the switch unit to output the modulation signal to the amplifier.

The digital demodulation unit is electrically connected to the analog digital convertor for generating a second demodulation signal. When the control unit detects the second demodulation signal is lower than the demodulation success rate in the time period, the control unit outputs a second switch signal to the switch unit, the second switch signal is used to control the switch unit to output the modulation signal to the delay unit and the demodulation unit.

To sum up, the demodulation circuit and the wireless charging device using the same provided by the embodiments in the instant disclosure can demodulate a modulation signal via comparing the modulation signal and its delay signal and then obtain a first demodulation signal. Compared with the traditional demodulation circuit, the demodulation circuit provided by the embodiments in the instant disclosure can demodulate the modulation signal without a low-pass filter, a high-pass filter or other operational amplifiers, which decreases the manufacturing cost and the circuit area. Moreover, in the demodulation circuit provided by the embodiments in the instant disclosure, it is unnecessary to use many filters or operational amplifiers, so the overall power of circuit would be effectively reduced.

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which:

FIG. 6 shows a flow chart for an operation of a wireless charging device of an embodiment of the instant disclosure.

DETAILED DESCRIPTION OF PREFERRED EMBODIMENTS

Figure 1:
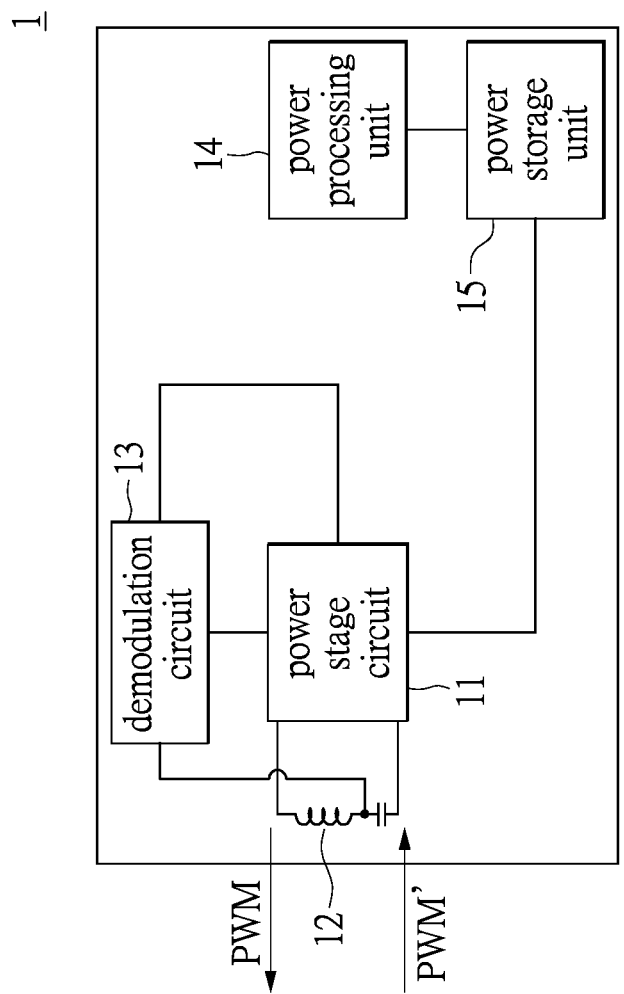
FIG. 1 shows a block diagram of a wireless charging device of one embodiment of the instant disclosure.

The aforementioned illustrations and following detailed descriptions are exemplary for the purpose of further explaining the scope of the instant disclosure. Other objectives and advantages related to the instant disclosure will be illustrated in the subsequent descriptions and appended drawings. In the drawings, the size and relative sizes of layers and regions may be exaggerated for clarity.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below which could be termed a second element, component, region, layer or section without departing from the teachings of the instant disclosure. As used herein, the term "and/or" includes any and all combinations of one or more of the associated listed items.

Please refer to FIG. 1, FIG. 1 shows a block diagram of a wireless charging device of one embodiment of the instant disclosure. The wireless charging device 1 comprises a power stage circuit 11, a coil 12, a demodulation circuit 13, a power processing unit 14 and a power storage unit 15. The power stage circuit 11 is electrically connected to the coil 12. The demodulation circuit 13 is electrically connected to the power stage circuit 11 and the coil 12. The power processing unit 14 is electrically connected to the power storage unit 15. The power storage unit 15 is electrically connected to the power stage circuit 11. The demodulation circuit 13 receives a pulse width modulation signal and performs near distance wireless charging.

The wireless charging device 1 is a unidirectional wireless charging device or a bidirectional wireless charging device. If the wireless charging device 1 is a unidirectional wireless charging device, the wireless charging device 1 is used as a transmitter. Under this circumstance, the wireless charging device 1 does not include any elements necessary for a receiver. For example, the wireless charging device 1 does not include a modulation unit, a rectification unit or a voltage-regulating unit that are necessary for a receiver. The wireless charging device 1, such as a wireless charger, can charge other wireless charging devices, such as a mobile phone, a tablet computer, a laptop, a smart watch, a set top box or the like.

If the wireless charging device 1 is a bidirectional wireless charging device, the wireless charging device 1 can be used as a transmitter or a receiver. In this case, in addition to the power stage circuit 11, the coil 12, the demodulation circuit 13, the power processing unit 14 and the power storage unit 15, the wireless charging device 1 further comprises a modulation unit, a rectification unit, a voltage-regulating unit, another control unit and another power stage circuit (not shown in FIG. 1), so that the wireless charging device 1 can work as a transmitter or a receiver via corresponding elements. The wireless charging device 1 can be a bidirectional wireless charging device mentioned above. If the wireless charging device 1 is used as a transmitter, it can provide electromagnetic energy to other wireless charging devices. If the wireless charging device 1 is used as a receiver, it can receive electromagnetic energy provided by other wireless charging devices. The detailed structure and operation mechanism of the wireless charging device are well known by the skilled in the art, and the information is not repeated.

It will be understood that, the above description about the elements in the wireless charging device 1 is merely for instruction, and thus the instant disclosure should not be limited by these elements. The wireless charging device 1 can be a traditional unidirectional wireless charging device or a traditional bidirectional wireless charging device. For easy instruction and understanding of the instant disclosure, the wireless charging device 1 is, for example, a wireless charging device such as a transmitter, and the following description is a further teaching of the elements of the wireless charging device 1.

The power stage circuit 11 comprises a power switch, a Pulse Width Modulation (PWM) circuit, a high-frequency isolation transformer and an output filter (not shown in FIG. 1), for outputting a voltage to the coil 12.

The coil 12 can be a cable coil or other inductors that can generate an induced voltage correspondingly according to a variable electromagnetic field. The coil 12 can convert a voltage into a pulse width modulation (PWM) signal and send out the PWM signal. The PWM signal includes electromagnetic energy. Also, the coil 12 can receive a signal PWM' sent by other wireless charging devices, such as a receiver, and the signal PWM' includes electric quantity information of the receiver (for example, how much electric quantity is currently stored by the receiver).

The power processing unit 14 is configured to manage the electric energy stored by the wireless charging device 1. For example, the power processing unit 14 controls the power storage unit 15 to provide the electric energy to the power stage circuit 11.

The power storage unit 15, such as a battery of the wireless charging device 1 or other power storage device (such as a capacitor), is configured to store the electric energy. The power storage unit 15 is also configured to provide the electric energy to the power stage circuit 11, so that the power stage circuit 11 can provide a voltage to the coil 12.

Figure 2:
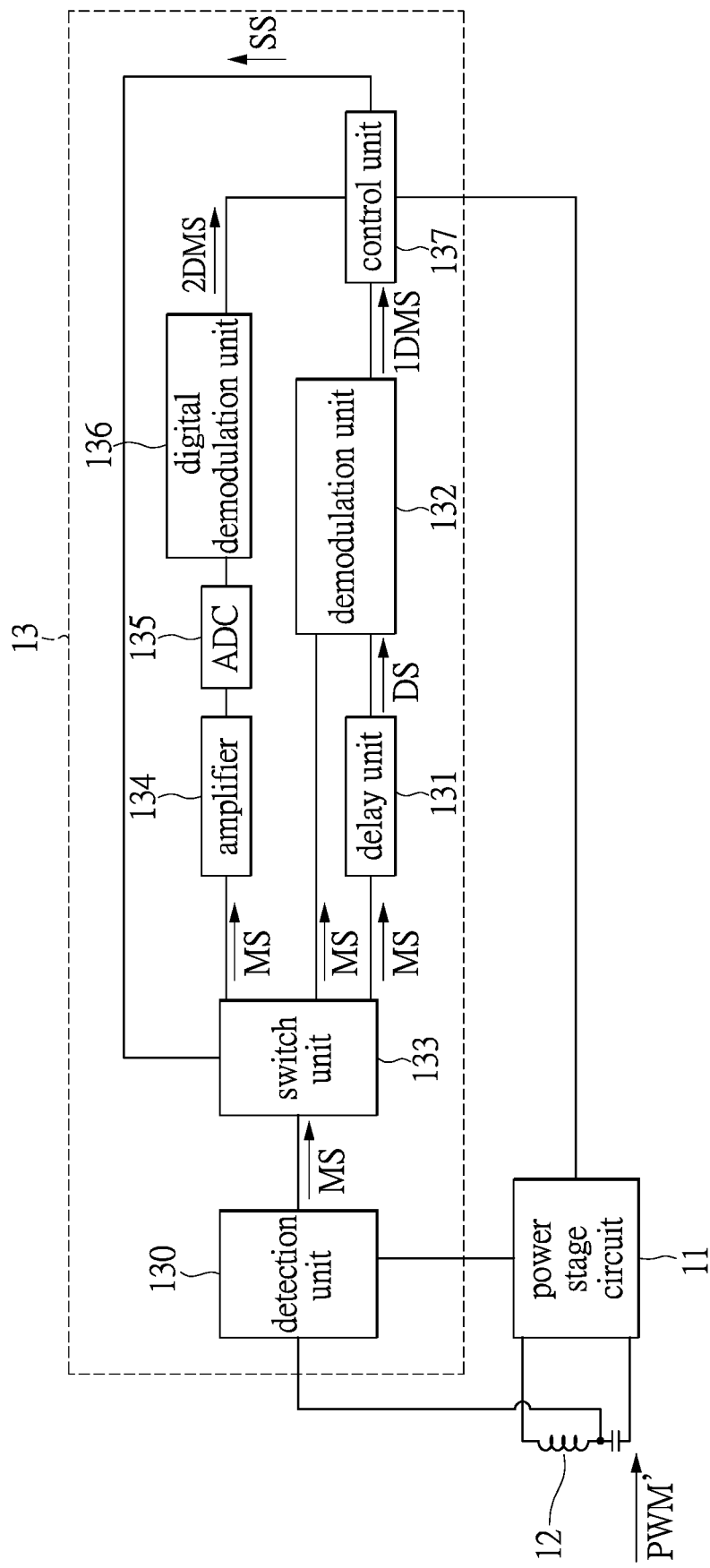
FIG. 2 shows a block diagram of a demodulation circuit of one embodiment of the instant disclosure.

Please refer to FIG. 2. FIG. 2 shows a block diagram of a demodulation circuit of one embodiment of the instant disclosure. The demodulation circuit 13 is configured to detect the signal PWM' received by the coil 12 or the power stage circuit 11, and to demodulate the signal PWM'. The demodulation circuit 13 further comprises a detection unit 130, a delay unit 131, a demodulation unit 132, a switch unit 133, an amplifier 134, an analog digital convertor (ADC) 135, a digital demodulation unit 136 and a control unit 137. The detection unit 130 is electrically connected to the coil 12 or the power stage circuit 11, which depends on the type of the detection unit 130. The switch unit 133 is electrically connected to the detection unit 130. The delay unit 131 is electrically connected to the switch unit 133. The demodulation unit 132 is electrically connected to the switch unit 133, the delay unit 131 and the control unit 137. The amplifier 134 is electrically connected to the switch unit 133. The analog digital convertor 135 is electrically connected to the amplifier 134. The digital demodulation unit 136 is electrically connected to the analog digital convertor 135 and the control unit 137.

The detection unit 130 is, for example, a current detection unit or a voltage detection unit. If the detection unit 130 is a current detection unit, the detection unit 130 detects a current amplitude change when the power stage circuit 11 receives the signal PWM', so as to obtain a modulation signal MS. The modulation signal MS is an analog data signal. The modulation signal MS includes the electric quantity information of the receiver, for example, how much electric quantity is currently stored in the receiver. If the detection unit 130 is a voltage detection unit, the detection unit 130 detects a voltage amplitude change when the coil 12 receives the signal PWM', so as to obtain a modulation signal MS.

The delay unit 131 is configured to delay the modulation signal MS and to generate a delay signal DS of the modulation signal MS. The demodulation unit 132 receives and compares the modulation signal MS and the delay signal DS, so as to generate a first demodulation signal 1DMS. In addition, the first demodulation signal 1DMS is a binary data signal. The first demodulation signal 1DMS includes an energy storage status of the receiver, for example, how much energy is currently stored. After that, the demodulation unit 132 outputs the first demodulation signal 1DMS to the control unit 137. The control unit 137 correspondingly adjusts the voltage or the electromagnetic energy output by the power stage circuit 11 according to the energy storage status of the receiver indicated by the first demodulation signal 1DMS, so as to adjust the electromagnetic energy of the pulse width modulation signal PWM.

For example, when the first demodulation signal 1DMS or a second demodulation signal 2DMS indicates that the energy stored in the receiver reaches a predetermined value (such as 90% of the maximum stored energy of the receiver), the control unit 137 would make the power stage circuit 11 stop outputting the voltage or the electromagnetic energy to the coil 12. In another case, when the first demodulation signal 1DMS or the second demodulation signal 2DMS indicates that the energy stored in the receiver is within a predetermined range (such as 70%-90% of the maximum stored energy of the receiver), the control unit 137 would control the voltage or the electromagnetic energy output by the power stage circuit 11 to the coil 12.

Figure 3:
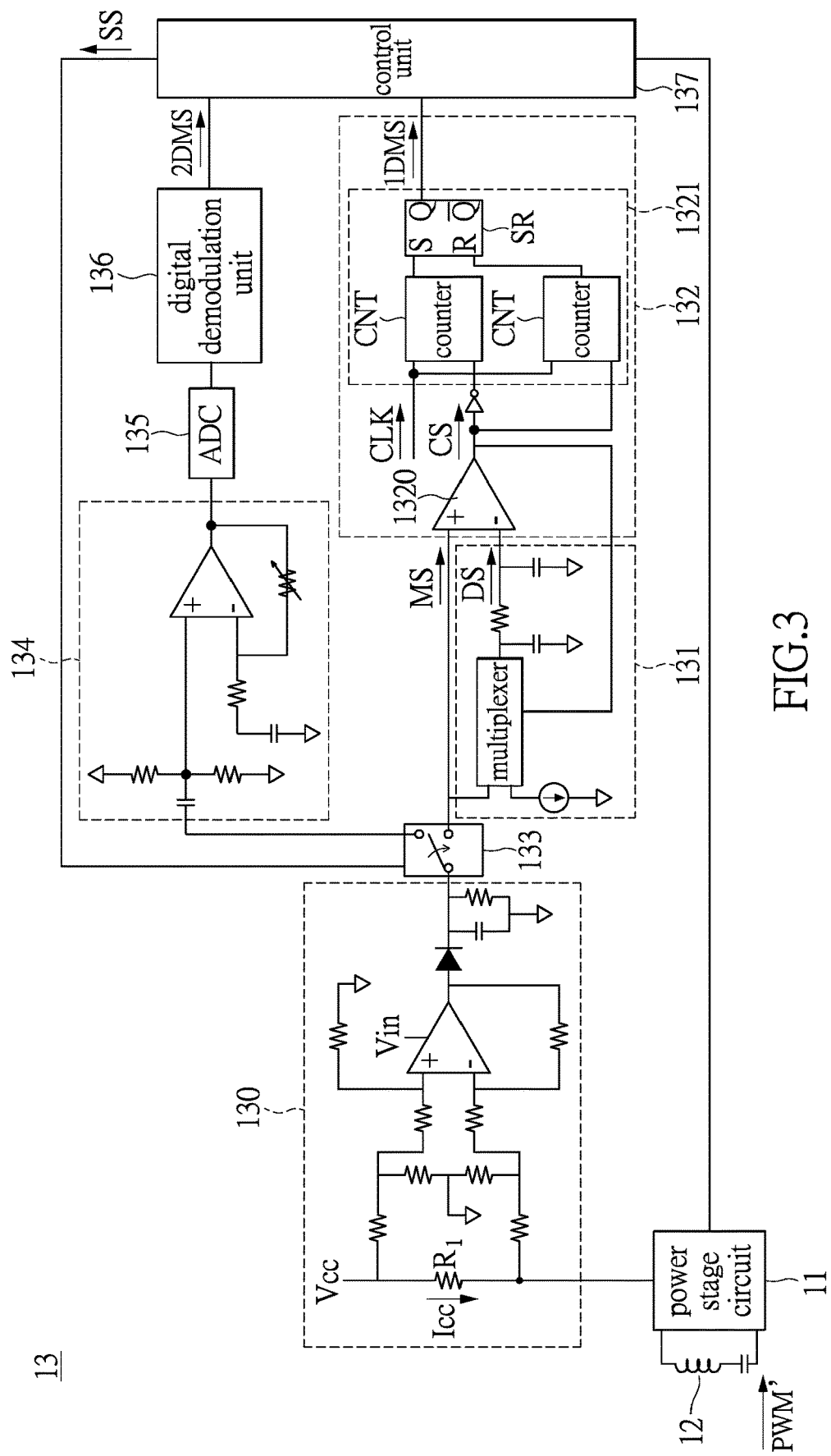
FIG. 3 shows a schematic diagram of a demodulation circuit of one embodiment of the instant disclosure.

Please refer to FIG. 3. FIG. 3 shows a schematic diagram of a demodulation circuit of one embodiment of the instant disclosure. As described above, the demodulation circuit 13 comprises a detection unit 130, a delay unit 131, a demodulation unit 132, a switch unit 133, an amplifier 134, an analog digital convertor (ADC) 135, a digital demodulation unit 136 and a control unit 137. Regarding the relevant connecting relationships between the detection unit 130, the delay unit 131 and the demodulation unit 132 in the instant disclosure, it is identical to the previous embodiment, and it is not repeated.

In this embodiment, the detection unit 130 is a current detection unit of which the circuit consists of resistors, amplifiers, diodes and capacitors. The amplifier receives an input voltage Vin. The resistors include a first resistor R1. One end of the first resistor R1 is electrically connected to the power stage circuit 11 (such as the power stage circuit 11 shown in FIG. 1 and FIG. 2), and the other end of the first resistor R1 receives a working voltage VCC. It should be noted that, the composition and structure of the detection unit 130 shown in FIG. 3 is merely for instruction, and thus the instant disclosure should not be limited thereto. The structure of the detection unit 130 in other embodiments can be different, as long as the detection unit 130 has a current detecting function.

After the coil receives the signal PWM', based on the electromagnetic induction principle, the coil 12 would correspondingly induce the power stage circuit 11 according to the signal PWM', so that the power stage circuit 11 would generate a current. The current generated by the power stage circuit 11 would affect a current ICC flowing through the first resistor R1, so that the amplitude of the current ICC would change. The current ICC is related to the working voltage VCC. The detection unit 130 detects an amplitude change of the current ICC to obtain a modulation signal MS.

The delay unit 131 is a resistor-capacitor network consisting of at least one capacitor and one resistor. Via the resistor-capacitor network, the modulation signal MS would result in a RC delay and generate a delay signal DS. In short, the modulation signal MS plus a period of delay time equals to the delay signal DS, resulting in a signal delay via a resistor-capacitor network well known by those skilled in the art and thus the information is not repeated. In addition, the composition and structure of the delay unit 131 shown in FIG. 3 is merely for instruction, and thus the instant disclosure should not be limited thereto. Those skilled in the art can design the structure of the delay unit 131 based on need.

The amplifier 134 consists of resistors, amplifiers, variable resistances and capacitors. The amplifier 134 is configured to amplify the modulation signal MS. The switch unit 133 is configured to output the modulation signal MS to the amplifier 134, the delay unit 131 or the demodulation unit 132. The analog digital convertor 135 transforms an analog modulation signal into a digital modulation signal.

When the voltage level of the modulation signal MS is higher than or equal to a voltage level of the delay signal DS, the demodulation unit 132 outputs a high logic level first demodulation signal 1DMS to the control unit 137. When the voltage level of the modulation signal MS is lower than the voltage level of the delay signal DS, the demodulation unit 132 outputs a low logic level first demodulation signal 1DMS to the control unit 137. When the control unit detects the first demodulation signal is lower than the demodulation success rate in the time period, the control unit 137 outputs a switch signal SS (the following use a first switch signal 1SS to call it) to the switch unit 133, the first switch signal 1SS is used to control the switch unit 133 to output the modulation signal MS to the amplifier 134.

When the control unit 137 detects the second demodulation signal 2DMS is lower than the demodulation success rate in the time period, the control unit 137 outputs the switch signal SS (the following use a second switch signal 2SS to call it) to the switch unit 133, the second switch signal 2SS is used to control the switch unit 133 to output the modulation signal MS to the delay unit 131 and the demodulation unit 132.

Figure 5:
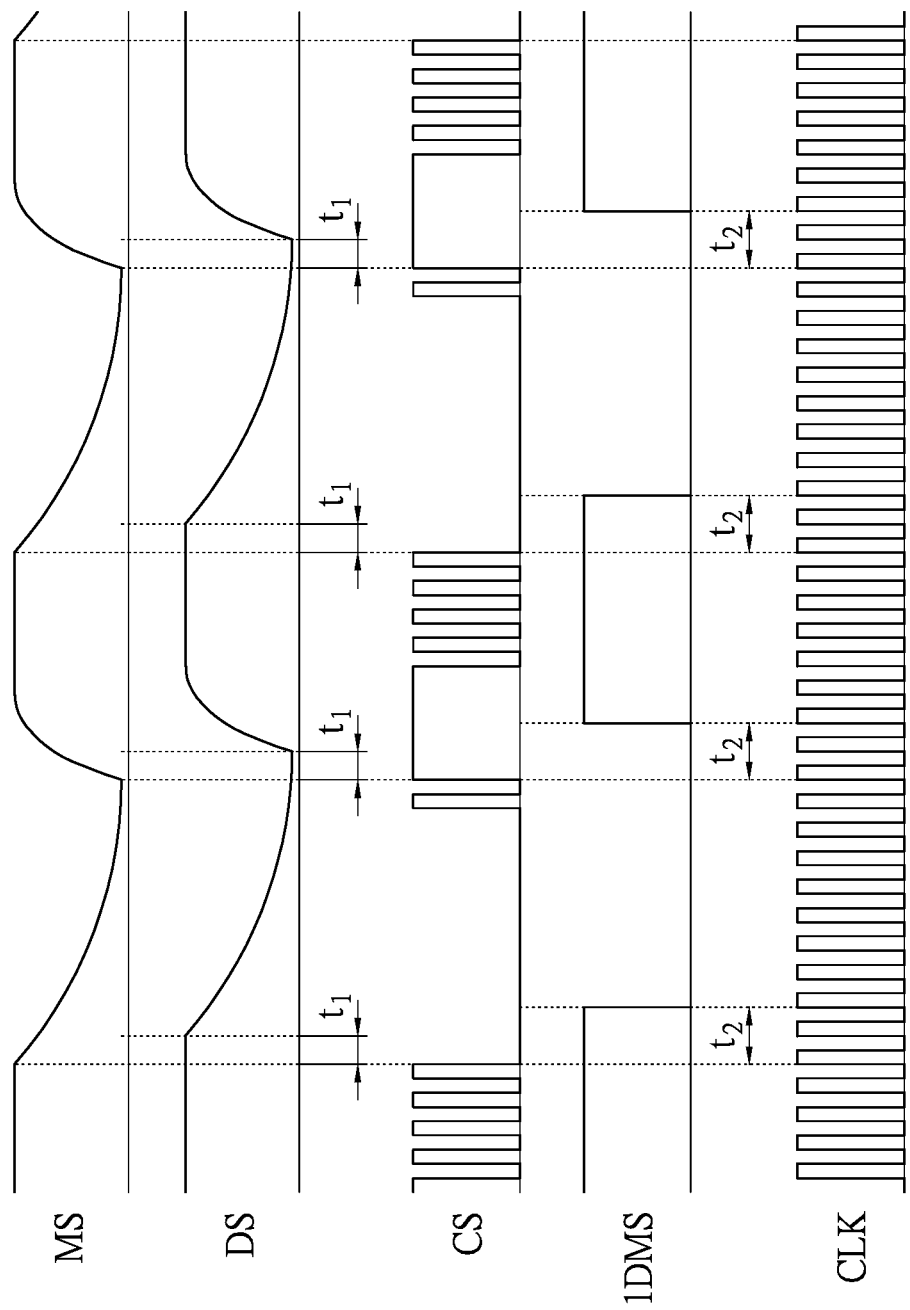
FIG. 5 shows a waveform timing diagram for an operation of a demodulation circuit of an embodiment of the instant disclosure.

In conjunction with FIG. 3, FIG. 5 shows a waveform timing diagram for an operation of a demodulation circuit of an embodiment of the instant disclosure. The two waveforms shown at the upper side of FIG. 5 respectively represent the modulation signal MS and the delay signal DS. The modulation signal MS and the delay signal DS are analogue signals of which the voltage levels are related to a voltage change resulting from a signal PWM'. From FIG. 5, the modulation signal MS plus a period of delay time t1 equals to a delay signal DS. In addition, the structure of the resistor-capacitor network can be designed by those skilled in the art to adjust the delay time t1, and how long the delay time t1 would be is not limited herein.

The demodulation unit 132 comprises a comparator 1320 and a logic controller 1321. The non-inverting input end of the comparator 1320 is electrically connected to the switch unit 133, and the inverting input end of the comparator 1320 is electrically connected to the delay unit 131. The output end of the comparator 1320 is electrically connected to the logic controller 1321. The logic controller 1321 is electrically connected to the control unit 137. The logic controller 1321 consists of at least one counter CNT and a latch circuit SR. The counter CNT is electrically connected to the comparator 1320 for receiving a clock signal CLK and the comparison signal CS. The latch circuit SR is electrically connected to the counter CNT for calculating a time duration when the comparison signal CS is maintaining at the same logic level.

The non-inverting input end of the comparator 1320 receives the modulation signal MS and the inverting input end of the comparator 1320 receives the delay signal DS. After that, the comparator 1320 compares the voltage level of the modulation signal MS and the delay signal DS and outputs a comparison signal CS. Referring to FIG. 5 based on FIG. 3, the three waveforms shown at the upper side of FIG. 5 respectively represent the modulation signal MS, the delay signal DS and the comparison signal CS. If the voltage level of the modulation signal MS is higher than or equal to the voltage level of the delay signal DS, the comparator 1320 outputs a comparison signal CS having a high logic level. On the other hand, if the voltage level of the modulation signal MS is lower than the voltage level of the delay signal DS, the comparator 1320 outputs a comparison signal CS having a low logic level. Thereby, the comparator 1320 will obtain a comparison signal CS having a high logic level or a low logic level.

The logic controller 1321 is further electrically connected to a timing generator (not shown in FIG. 3). The logic controller 1321 receives the comparison signal CS and a clock signal CLK outputted by the timing generator, and compares the comparison signal CS and the clock signal CLK. In a further instruction, the modulation signal MS and the delay signal DS would be affected by noise, so the voltage levels of the modulation signal MS and the delay signal DS would not be constant. In addition, the logic level of the comparison signal CS is related to voltage level of the modulation signal MS and the delay signal DS. In other words, the logic level of the comparison signal CS would also be affected by noise and thus change. In order to avoid an error demodulation caused by noise, the demodulation unit 132 comprises a logic controller 1321. The logic controller 1321 calculates a time duration when the comparison signal CS maintains at the same logic level via the clock signal CLK.

Please again refer to FIG. 5. The three waveforms shown at the lower side of FIG. 5 respectively represent the comparison signal CS, the first demodulation signal 1DMS and the clock signal CLK. If the time duration when the comparison signal CS maintains at the same logic level is over a predetermined time duration t2, the logic controller outputs the first demodulation signal 1DMS according to the logic level of the comparison signal CS. In other words, the first demodulation signal 1DMS is generated according to the comparison signal CS. If the time duration when the comparison signal CS maintains at the same logic level is not over a predetermined time duration t2, the logic level of the first demodulation signal 1DMS outputs by the latch circuit SR of the logic controller 1321 would not change but maintain at its original logic level.

For example, if the logic controller 1321 determines that the time duration when the comparison signal CS maintains at a high logic level is over the predetermined time duration t2, the logic controller 1321 outputs the first demodulation signal 1DMS at a high logic level (such as the "1" in a binary system). If the logic controller 1321 determines that the time duration when the comparison signal CS maintains at a high logic level is not over the predetermined time duration t2, the logic controller 1321 maintains the first demodulation signal 1DMS at its original logic level. On the other hand, the logic controller 1321 determines that the time duration when the comparison signal CS maintains at a low logic level is over a predetermined time duration t2, the latch circuit SR of the logic controller 1321 outputs the first demodulation signal 1DMS at a low logic level (such as the "0" in a binary system). If the logic controller 1321 determines that the time duration when the comparison signal CS maintains at a low logic level is not over a predetermined time duration t2, the latch circuit SR of the logic controller 1321 maintains the first demodulation signal 1DMS at its original logic level.

In addition, the predetermined time duration t2 is, for example, an interval between one of the rising edges of the clock signal CLK and the next two rising edge of the clock signal CLK (that is, the predetermined time duration t2 equals to two periods of the clock signal CLK). In this embodiment, the predetermined time duration t2 is 10 μs, but it is not limited herein. Those skilled in the art can design the length of the predetermined time duration t2 based on need.

After the control unit 137 receives the first demodulation signal 1DMS, the control unit 137 will control the power stage circuit (such as the power stage circuit 11, but not shown in FIG. 3) according to the first demodulation signal 1DMS, so that the power stage circuit 11 will change the output voltage or the electromagnetic energy and further adjust the electromagnetic energy included in the signal PWM', and output signal PWM by the wireless charging device 1.

From the above, the logic controller 1321 calculates the time duration when the comparison signal CS maintains at the same logic level via the clock signal CLK, so as to generate the first demodulation signal 1DMS. In other embodiments, the demodulation unit 132 does not include the logic controller 1321. The demodulation unit 132 uses the comparison signal CS output by the comparator 1320 to calculate the first demodulation signal 1DMS, and outputs it to the control unit 137 so that the control unit 137 correspondingly controls the power stage circuit 11 according to the first demodulation signal 1DMS.

Figure 4:
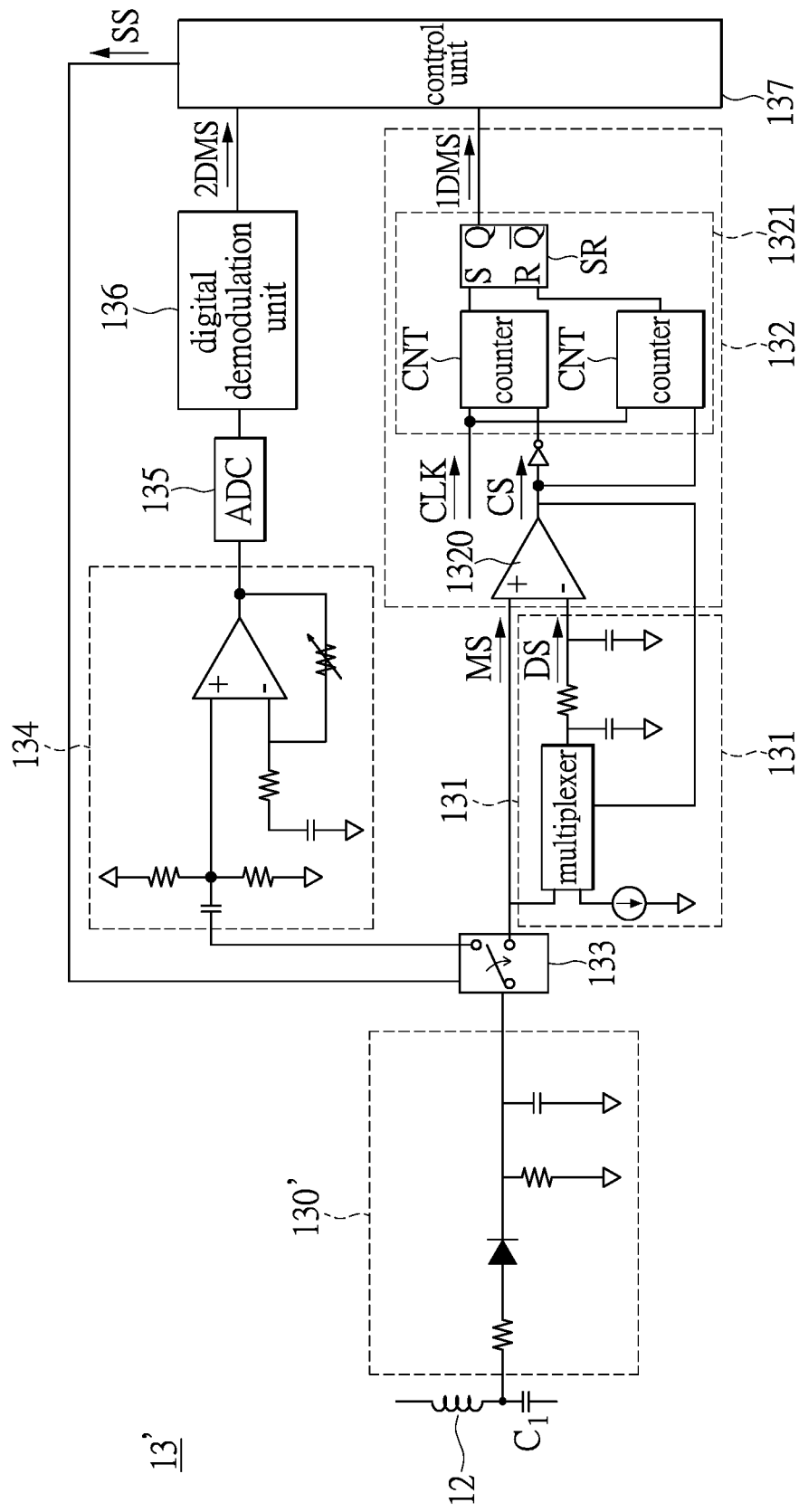
FIG. 4 shows a schematic diagram of a demodulation circuit of another embodiment of the instant disclosure.

Please refer to FIG. 4. FIG. 4 shows a schematic diagram of a demodulation circuit of another embodiment of the instant disclosure. The demodulation circuit 13' shown in FIG. 4 comprises a detection unit 130', a delay unit 131, a demodulation unit 132, a switch unit 133, an amplifier 134, an analog digital convertor 135, a digital demodulation unit 136 and a control unit 137. Regarding the relevant connecting relationship between the detection unit 130', the delay unit 131 and the demodulation unit 132, the switch unit 133, the amplifier 134, the analog digital convertor 135, the digital demodulation unit 136 and the control unit 137 in the instant disclosure, it is identical to the previous embodiment, and it is not repeated.

Different from the demodulation circuit 13 shown in FIG. 3, the detection unit 130' shown in FIG. 4 is a voltage detection unit consisting of resistors, diodes and capacitors.

After the coil 12 receives the signal PWM' output by the receiver, based on the electromagnetic induction principle, the coil 12 will correspondingly generate a voltage according to the signal PWM'. In other words, the amplitude of voltage generated by the coil 12 will change because of the signal PWM'. After that, the coil 12 charges the first capacitor C1 by the generated voltage. The detection unit 130' obtains the modulation signal MS via detecting the change of amplitude of the charging voltage of the first capacitor C1. It should be noted that the composition and structure of the detection unit 130' shown in FIG. 4 is merely for instruction, and thus the instant disclosure should not be limited thereto. The structure of the detection unit 130' in other embodiments can be different, as long as the detection unit 130' has a voltage detecting function.

Please refer to FIG. 6. FIG. 6 shows a flow chart for an operation of a wireless charging device of an embodiment of the instant disclosure. The operation shown in FIG. 6 is applied to the above wireless charging device. In Step S601, the coil receives a PWM' signal. The detection unit obtains a modulation signal via detecting an amplitude change of voltage generated by the coil because of the PWM' signal or via detecting an amplitude change of current generated by the power stage circuit because of the PWM' signal. In Step S602, the delay unit receives and delays the modulation signal output by the detection unit, so as to generate a delay signal. In Step S603, the comparator of the demodulation unit compares the voltage levels of the modulation signal and the delay signal. If the voltage level of the modulation signal is higher than or equal to the voltage level of the delay signal, it goes to Step S604. If the voltage level of the modulation signal is lower than the voltage level of the delay signal, it goes to Step S605. In Step S604, the comparator outputs a comparison signal at a high logic level. In Step S605, the comparator outputs a comparison signal at a low logic level.

In Step S606, the logic controller receives the comparison signal at a high logic level, and calculates whether the time duration when the comparison signal maintains at the high logic level is over a predetermined time duration via clock signals. If the time duration when the comparison signal maintains at a high logic level is over the predetermined time duration, it goes to Step S607. If the time duration when the comparison signal maintains at a high logic level is not over the predetermined time duration, it goes to Step S608. In Step S607, the logic controller outputs a first demodulation signal at a high logic level. In Step S608, the logic controller outputs the first demodulation signal remaining at its original logic level.

In Step S609, the logic controller receives a comparison signal at a low logic level, and calculates whether the time duration when the comparison signal maintains at the low logic level is over a predetermined time duration via clock signals. If the time duration when the comparison signal maintains at the low logic level is over the predetermined time duration, it goes to Step S610. If the time duration when the comparison signal maintains at the low logic level is not over the predetermined time duration, it goes to Step S611. In Step S610, the logic controller outputs the first demodulation signal at a low logic level. In Step S611, the logic controller outputs the first demodulation signal remaining at its original logic level. In Step S612, the control unit receives the demodulation signal and correspondingly controls the power stage circuit according to the demodulation signal.

To sum up, the demodulation circuit and the wireless charging device using the same provided by the embodiments in the instant disclosure can demodulate a modulation signal via comparing the modulation signal and its delay signal and then obtain a first demodulation signal. Compared with the traditional demodulation circuit, the demodulation circuit provided by the embodiments in the instant disclosure can demodulate the modulation signal without a low-pass filter, a high-pass filter or other operational amplifiers, decreasing the manufacturing cost and the circuit area. Moreover, in the demodulation circuit provided by the embodiments in the instant disclosure, it is unnecessary to use many filters or operational amplifiers, so the overall power of circuit would be effectively reduced.

The demodulation circuit provided by embodiments of the instant disclosure includes amplifier, analog digital convertor and digital demodulation unit. In other words, the modulation signal can go through any digital process or analog process by the switch unit. The demodulation circuit can demodulate the PWM' signal received by the coil via the detection unit, the switch unit, the delay unit, the demodulation unit, the amplifier, the analog digital convertor, and the digital demodulation unit. Compared to the traditional demodulation circuit, the demodulation circuit provided by embodiments of the instant disclosure can obtain a demodulation signal effectively.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A demodulation circuit, used in a wireless charging device and receives a pulse width modulation signal, the demodulation circuit performs near distance wireless charging, the demodulation circuit comprising:
   a detection unit, electrically connected to a coil and a power stage circuit for detecting the pulse width modulation signal received by the coil and outputting a modulation signal, the modulation signal is an analog data signal;
   a switch unit, electrically connected to the detection unit;
   a delay unit, electrically connected to the switch unit for delaying the modulation signal and generating a delay signal; and
   a demodulation unit, electrically connected to the switch unit and the delay unit for comparing the modulation signal and the delay signal so as to generate a first demodulation signal, wherein the first demodulation signal is a binary data signal;
   an amplifier, electrically connected to the switch unit for amplifying the modulation signal, the switch unit is used to output the modulation signal to the amplifier, the delay unit or the demodulation unit;
   an analog digital convertor, electrically connected to the amplifier, the analog digital convertor transforms an analog modulation signal into a digital modulation signal; and
   a digital demodulation unit, electrically connected to the analog digital convertor for generating a second demodulation signal;
   wherein when the voltage level of the modulation signal is higher than or equal to a voltage level of the delay signal, the demodulation unit outputs a high logic level first demodulation signal to the control unit;
   wherein when the voltage level of the modulation signal is lower than the voltage level of the delay signal, the demodulation unit outputs a low logic level first demodulation signal to the control unit;
   wherein when the control unit detects the first demodulation signal is lower than a demodulation success rate in a time period, the control unit outputs a first switch signal to the switch unit, the first switch signal is used to control the switch unit to output the modulation signal to the amplifier;
   wherein when the control unit detects the second demodulation signal is lower than the demodulation success rate in the time period, the control unit outputs a second switch signal to the switch unit, the second switch signal is used to control the switch unit to output the modulation signal to the delay unit and the demodulation unit.

2. The demodulation circuit according to claim 1, wherein the detection unit is a current detection unit for detecting an amplitude change of current generated by the power stage circuit.

3. The demodulation circuit according to claim 1, wherein the detection unit is a voltage detection unit for detecting an amplitude change of voltage generated by the coil.

4. The demodulation circuit according to claim 1, wherein the delay unit is a resistor-capacitor network consisting of at least one capacitor and one resistor.

5. The demodulation circuit according to claim 1, wherein the demodulation unit comprises:
   a comparator, electrically connected to the switch unit and the delay unit for comparing the modulation signal and the delay signal and outputting a comparison signal;
   wherein the demodulation signal is generated according to the comparison signal.

6. The demodulation circuit according to claim 5, wherein the demodulation unit comprises:
   a logic controller, electrically connected to the comparator, the logic controller further comprises:
   at least one counter, electrically connected to the comparator for receiving a clock signal and the comparison signal; and
   a latch circuit, electrically connected to the counter for calculating a time duration when the comparison signal is maintaining at the same logic level;
   wherein if the time duration when the comparison signal is maintaining at a high logic level is over a predetermined time duration, the latch circuit outputs a first demodulation at the high logic level according to a logic level of the comparison signal, if the time duration when the comparison signal is maintaining at the high logic level is not over the predetermined time duration, the latch circuit keeps the first demodulation signal at its original logic level, if the time duration when the comparison signal is maintaining at a low logic level is over the predetermined time duration, the latch circuit outputs a first demodulation at the low logic level according to the logic level of the comparison signal, and if the time duration when the comparison signal is maintaining at the low logic level is not over the predetermined time duration, the latch circuit keeps the first demodulation signal at its original logic level.

7. The demodulation circuit according to claim 1, wherein the wireless charging device is a unidirectional wireless charging device or a bidirectional wireless charging device.

8. A wireless charging device, used to receive a pulse width modulation signal, the wireless charging device performs near distance wireless charging, the wireless charging device comprising:
   a coil, for receiving the pulse width modulation signal;
   a power stage circuit, electrically connected to the coil, for outputting a voltage or an electromagnetic energy to the coil; and a demodulation circuit, electrically connected to the coil and the power stage circuit, the demodulation circuit comprising:
a control unit, electrically connected to the power stage circuit, for controlling the power stage circuit;
a detection unit, electrically connected to the coil and the power stage circuit for detecting the pulse width modulation signal received by the coil and outputting a modulation signal, the modulation signal is an analog data signal;
a switch unit, electrically connected to the detection unit;
a delay unit, electrically connected to the switch unit for delaying the modulation signal and generating a delay signal;
a demodulation unit, electrically connected to the switch unit and the delay unit for comparing the modulation signal and the delay signal so as to generate a first demodulation signal, wherein the first demodulation signal is a binary data signal;
an amplifier, electrically connected to the switch unit for amplifying the modulation signal, the switch unit is used to output the modulation signal to the amplifier, the delay unit or the demodulation unit;
an analog digital convertor, electrically connected to the amplifier, the analog digital convertor transforms an analog modulation signal into a digital modulation signal; and
a digital demodulation unit, electrically connected to the analog digital convertor for generating a second demodulation signal;
wherein when the voltage level of the modulation signal is higher than or equal to a voltage level of the delay signal, the demodulation unit outputs a high logic level first demodulation signal to the control unit;
wherein when the voltage level of the modulation signal is lower than the voltage level of the delay signal, the demodulation unit outputs a low logic level first demodulation signal to the control unit;
wherein when the control unit detects the first demodulation signal is lower than a demodulation success rate in a time period, the control unit outputs a first switch signal to the switch unit, the first switch signal is used to control the switch unit to output the modulation signal to the amplifier;
wherein when the control unit detects the second demodulation signal is lower than the demodulation success rate in the time period, the control unit outputs a second switch signal to the switch unit, the second switch signal is used to control the switch unit to output the modulation signal to the delay unit and the demodulation unit.

9. The wireless charging device according to claim 8, wherein the detection unit is a current detection unit for detecting an amplitude change of current generated by the power stage circuit.

10. The wireless charging device according to claim 8, wherein the detection unit is a voltage detection unit for detecting an amplitude change of voltage generated by the coil.

11. The wireless charging device according to claim 8, wherein the delay unit is a resistor-capacitor network consisting of at least one capacitor and one resistor.

12. The wireless charging device according to claim 8, wherein the demodulation unit comprises:
a comparator, electrically connected to the switch unit and the delay unit for comparing the modulation signal and the delay signal and outputting a comparison signal;
wherein the demodulation signal is generated according to the comparison signal.

13. The wireless charging device according to claim 12, wherein the demodulation unit comprises:
a logic controller, electrically connected to the comparator, the logic controller further comprises:
at least one counter, electrically connected to the comparator for receiving a clock signal and the comparison signal; and
a latch circuit, electrically connected to the counter for calculating a time duration when the comparison signal is maintaining at the same logic level;
wherein if the time duration when the comparison signal is maintaining at a high logic level is over a predetermined time duration, the latch circuit outputs a first demodulation signal at the high logic level according to a logic level of the comparison signal, if the time duration when the comparison signal is maintaining at the high logic level is not over the predetermined time duration, the latch circuit keeps the first demodulation signal at its original logic level, if the time duration when the comparison signal is maintaining at a low logic level is over the predetermined time duration, the latch circuit outputs a first demodulation signal at the low logic level according to the logic level of the comparison signal, and if the time duration when the comparison signal is maintaining at the low logic level is not over the predetermined time duration, the latch circuit keeps the first demodulation signal at its original logic level.

14. The wireless charging device according to claim 8, wherein the wireless charging device is a unidirectional wireless charging device or a bidirectional wireless charging device.

* * * * *